(12) United States Patent
Hsu

(10) Patent No.: US 7,193,324 B2
(45) Date of Patent: Mar. 20, 2007

(54) CIRCUIT STRUCTURE OF PACKAGE SUBSTRATE

(75) Inventor: Chi-Hsing Hsu, Taipei Hsien (TW)

(73) Assignee: Via Technologies, Inc., Taipei Hsien (TW)

(*) Notice: Subject to any disclaimer, the term of this patent is extended or adjusted under 35 U.S.C. 154(b) by 0 days.

(21) Appl. No.: 10/905,803

(22) Filed: Jan. 21, 2005

(65) Prior Publication Data

US 2006/0081990 A1 Apr. 20, 2006

(30) Foreign Application Priority Data

Oct. 18, 2004 (TW) .............................. 93131529 A

(51) Int. Cl.
 *H01L 23/48* (2006.01)
(52) U.S. Cl. ............... 257/758; 257/773; 257/E23.019
(58) Field of Classification Search ............... 257/758, 257/773, 775, 664, E23.019
See application file for complete search history.

(56) References Cited

U.S. PATENT DOCUMENTS

| | | | |
|---|---|---|---|
| 5,493,657 A * | 2/1996 | Van Brunt et al. .......... 710/305 |
| 6,066,548 A * | 5/2000 | Ma et al. ..................... 438/576 |
| 6,396,150 B2 * | 5/2002 | Kohno ......................... 257/758 |
| 6,521,530 B2 * | 2/2003 | Peters et al. ................. 438/667 |
| 6,747,340 B2 * | 6/2004 | Barnes et al. ............... 257/659 |
| 6,798,265 B2 * | 9/2004 | Nair et al. ................... 327/291 |
| 6,951,806 B1 * | 10/2005 | Schweikert et al. ........ 438/622 |
| 7,019,401 B2 * | 3/2006 | Chang et al. ............... 257/758 |
| 2002/0141171 A1 * | 10/2002 | Bohr .......................... 361/820 |
| 2004/0090282 A1 * | 5/2004 | Minami ......................... 333/1 |
| 2004/0165669 A1 * | 8/2004 | Otsuka et al. .............. 375/257 |
| 2004/0173822 A1 * | 9/2004 | Dutta .......................... 257/208 |
| 2004/0173880 A1 * | 9/2004 | Achyut ....................... 257/664 |
| 2005/0023650 A1 * | 2/2005 | Forbes ........................ 257/664 |

FOREIGN PATENT DOCUMENTS

JP 11-266105 * 9/1999

* cited by examiner

*Primary Examiner*—T. N. Quach
(74) *Attorney, Agent, or Firm*—Jiang Chyun IP Office

(57) ABSTRACT

A circuit structure for a package substrate or a circuit board is provided. The circuit structure has a dielectric layer with an upper surface and a lower surface, at least a first line and at least a second line. The first line is disposed on the dielectric layer on which a base of the first line is aligned with the upper surface. In addition, the second line is disposed on the dielectric layer on which a base of the second line is embedded below the upper surface. Since the second line is embedded into the dielectric layer, the distance with a reference plane is reduced and the crosstalk between the signals is further effectively reduced.

24 Claims, 4 Drawing Sheets

CIRCUIT STRUCTURE OF PACKAGE SUBSTRATE

CROSS-REFERENCE TO RELATED APPLICATION

This application claims the priority benefit of Taiwan application serial no. 93131529, filed Oct. 18, 2004.

BACKGROUND OF THE INVENTION

1. Field of the Invention

The present invention relates to a circuit structure, and more particularly, to a circuit structure which effectively avoids the crosstalk between signals.

2. Description of the Related Art

In a large size PCB (Printed Circuit Board) and package substrate the width of the signal lines for electrically coupling two components or two terminals must be fixed to maintain a constant characteristic impedance of the signal lines when the electronic signal is transmitted in the signal lines. In addition, in the general application and design since the distance between two signal lines is reduced, the capacitive coupling and the inductive coupling effect, occurred between the signals in the signal lines, is increased accordingly. Those coupling effect deteriorates near-end crosstalk and far-end crosstalk, thus signals cannot be accurately transmitted from one terminal to the other terminal of the signal line. Especially, when transmitting a signal in high-speed and high frequency, an unexpected noise crosstalk is occurred in another signal line due to the interference of the electromagnetic field.

FIGS. 1A and 1B schematically show a top view and a sectional view along with the line I—I in FIG. 1A of a conventional circuit structure, respectively. Herein, a general circuit substrate 100 is exemplified. A plurality of lines 110, 112, 114, 116 with same line width are disposed on an upper surface 122 of a dielectric layer 120, and a lower surface 124 of the dielectric layer 120 is disposed on a reference plane 130. Wherein, the distances between the respective lines 110, 112, 114, 116 and the reference plane 130 are all the same. The reference plane 130 is, for example, a power plane or a ground plane.

Note that in order to avoid crosstalk occurred on another signal, which influences the signal transmission quality, due to an electromagnetic field coupling occurred between the line 110 and the neighboring line 112 during transmitting a signal through the line 110, it is common in the prior art to increase the distances D1, D2 between the lines 112, 114 and another lines 110, 116. However, with such method, the free layout space of the substrate 100 is reduced inevitably.

SUMMARY OF THE INVENTION

Therefore, the present invention provides a circuit structure, which can reduce the crosstalk between the signals and further improve the signal transmission quality without reducing the layout space of the substrate.

The present invention further provides another circuit structure. With embedded circuit design, the circuit structure is able to prevent the important signals from being interfered by the crosstalk of the neighboring signal and further improves the signal transmission quality.

The circuit structure of the present invention comprises a dielectric layer, at least a first line and at least a second line. Wherein, the dielectric layer comprises an upper surface and a lower surface, and the first line is disposed on the dielectric layer on which a base of the first line is aligned with the upper surface. In addition, the second line is disposed on the dielectric layer on which a base of the second line is embedded below the upper surface.

Another circuit structure provided by the present invention comprises a dielectric layer, at least a first line and at least a second line. Wherein, the dielectric layer comprises an upper surface and a lower surface, and the first line is disposed on the dielectric layer on which a base of the first line is aligned with the upper surface. In addition, a plurality of second lines is disposed on the dielectric layer on which a base of the second lines is embedded below the upper surface.

The circuit structure according to the present invention mentioned above further comprises a reference plane, on which the dielectric layer is disposed. Wherein, the reference plane is, for example, a power plane or a ground plane. In addition, the circuit structure mentioned above further comprises a second dielectric layer or a solder mask layer, which covers the upper surface of the dielectric layer, the first line, and the second line.

The present invention further provides a circuit structure comprising a dielectric layer and at least a line. Wherein, the dielectric layer comprises an upper surface and a lower surface; and partial surface of at least one line is embedded below the upper surface of the dielectric layer.

The circuit structure according to the present invention mentioned above further comprises a reference plane, on which a base of the dielectric layer is disposed. Wherein, the reference plane is, for example, a power plane or a ground plane. In addition, the circuit structure mentioned above further comprises a second dielectric layer or a solder mask layer, which covers the upper surface of the dielectric layer and the surface of the line mentioned above.

The present invention uses embedded circuit structure to increase the distances of a line for transmitting the important signal and the other line for transmitting the neighbouring signal, thus the crosstalk problem can be diminished. In addition, since the distances between the lines are the same or relatively reduced, the layout space of the circuit substrate is further reduced.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE PREFERRED EMBODIMENTS

First Embodiment

A surface circuit layer of a general package substrate or circuit board is exemplified in the present embodiment. However, the structures of the joints in the surface circuit layer, the protection layer (e.g. Ni/Au) for preventing the surface circuit from oxidization, and the solder mask layer for preventing the surface circuit from adhering solders are not shown in the diagram. Accordingly, both the surface circuit and internal circuit can be substantially embodied in the present invention as long as they are complied with the circuit structure described in the present invention. In addition, although the package substrates 200, 300 are used as the preferred embodiments of the circuit structure in the present invention, it will be apparent to one of the ordinary skill in the art that the present invention also can be applied on other circuit or structure having equivalent function; thus details are omitted herein.

Figure 1A:
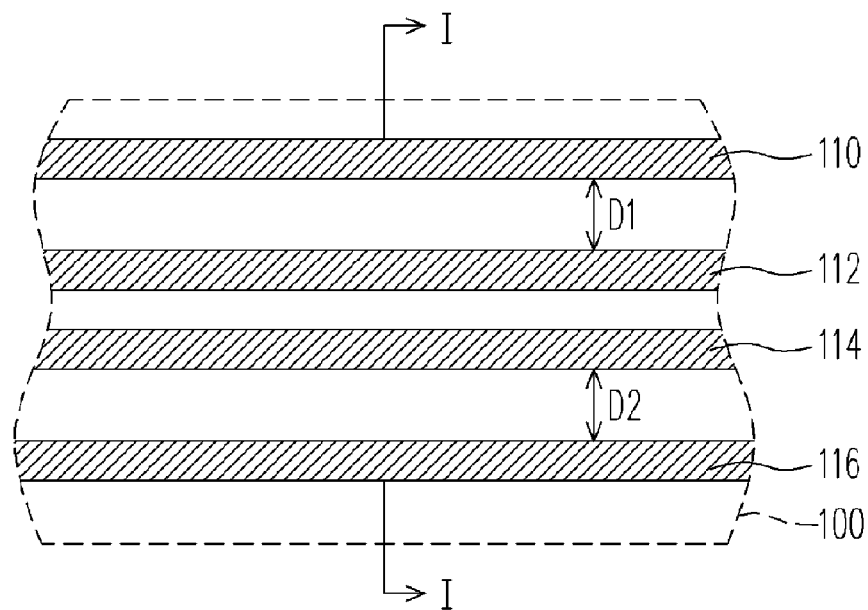
FIGS. 1A and 1B schematically show a top view and a sectional view along with the line I—I in FIG. 1A of a conventional circuit structure, respectively.
Figure 1B:
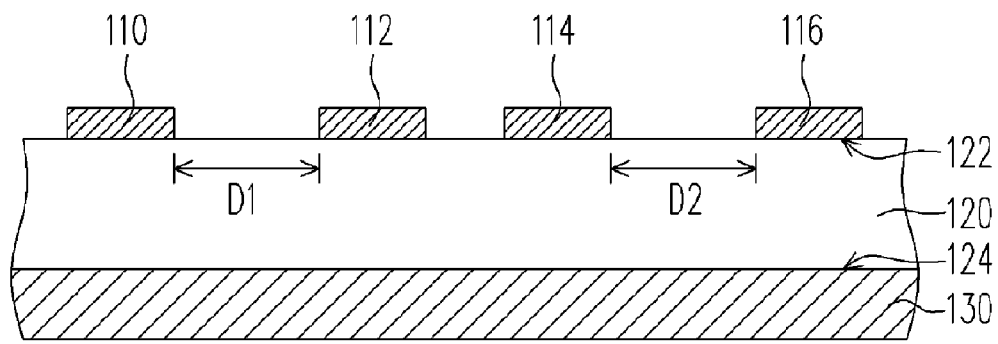
Figure 2A:
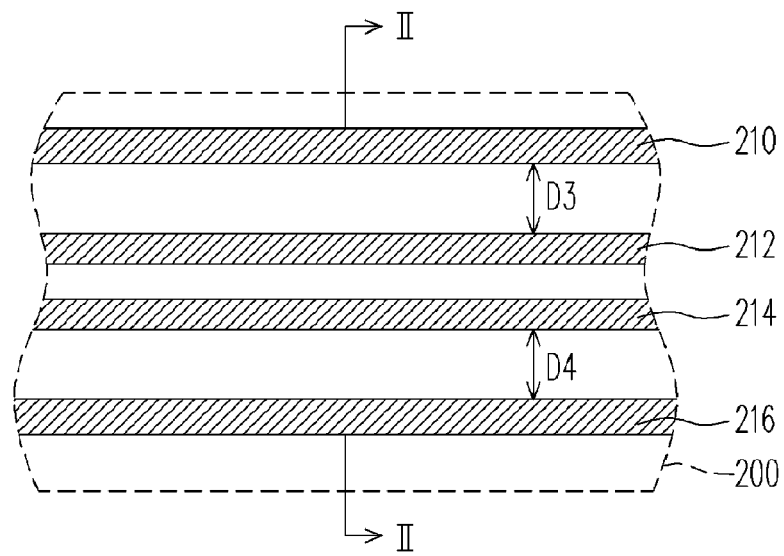
FIGS. 2A and 2B schematically show a top view and a sectional view along with the line II—II in FIG. 2A of a circuit structure according to a first embodiment of the present invention, respectively.
Figure 2B:
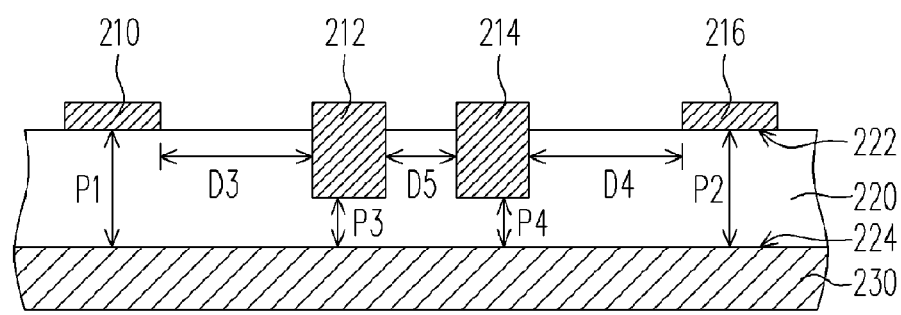

FIGS. 2A and 2B schematically show a top view and a sectional view along with the line II—II in FIG. 2A of a circuit structure according to a first embodiment of the present invention, respectively. For example, the circuit structure 202 comprises a plurality of first lines 210, 216, a plurality of second lines 212, 214, a dielectric layer 220, and a reference plane 230. Wherein, the dielectric layer 220 comprises an upper surface 222 and a lower surface 224, and the first lines 210, 216 are disposed on the upper surface 222 of the dielectric layer 220, on which the base of the first lines 210, 216 is aligned with the upper surface 222 of the dielectric layer 220. In addition, the second lines 212, 214 are also disposed on the dielectric layer 220; however, differently from the first lines 210, 216, the base of the second lines 212, 214 is embedded below the upper surface 222, such that the base of the second lines 212, 214 and the base of the first lines 210, 216 are not on the same plane.

Note that by using this embedded circuit design, it is possible to decrease crosstalk between the signals even the layout space of the substrate 200 is not reduced, and details are described hereinafter. Referring to FIG. 2B, when the base of the first lines 210, 216 and the base of the neighboring second lines 212, 214 are not disposed on the same plane of the dielectric layer 220, a reference plane 230 can be further disposed below a lower surface 224 of the dielectric layer 220, wherein the reference plane 230 may be a power plane or a ground plane. Since they are not disposed on the same plane, the distance P1, P2 between the first lines 210, 216 and the reference plane 230 is greater than the distance P3, P4 between the second lines 212, 214 and the reference plane 230, and the characteristic impedance of the second lines 212, 214 will be reduced as the decreasing of the distance. As discussed, the second lines 212, 214, originally having the same line width as that of the first lines 210, 216, can be replaced with a thinner line. Accordingly, the distances D3, D4 between the first lines 210, 216 and the neighboring second lines 212, 214 are getting wider due to the reduction of the line width of the second lines 212, 214, such that the crosstalk between the signals can be effectively reduced.

In other words, the free layout space of the circuit substrate 200 is relatively increased due to the decrease of the line width of the second lines 212, 214. As a result the area of the layout space of the substrate 200 is increased. In the present embodiment, the distance D5 between two neighboring second lines 212 and 214 may be equal to the distance D3 (the distance between the first line 210 and the neighboring second line 212) and D4 (the distance between the first line 216 and the neighboring second line 214). However, it is preferred that the distance D5 is smaller than the distance D3 or distance D4. Therefore, the second lines 212, 214 for transmitting the important signals are not easily interrupted by the crosstalk when the signal is switched on the neighboring first lines 210, 216, so the signal transmission quality is further improved. Wherein, the second lines 212, 214 are, for example, a differential signal-pair line or a clock signal-pair line. Wherein, the reference plane 230 is, for example, a power plane or a ground plane.

Second Embodiment

Figure 3A:
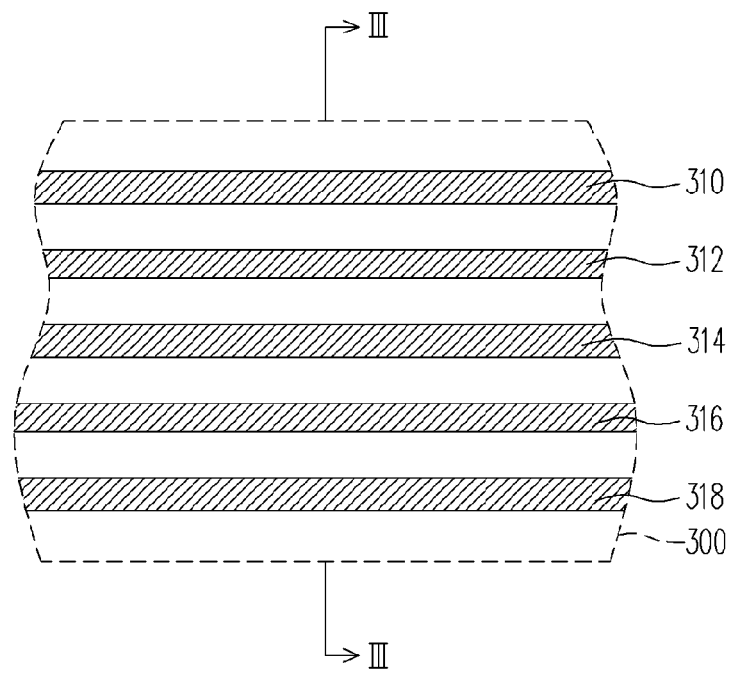
FIGS. 3A and 3B schematically show a top view and a sectional view along with the line III—III in FIG. 3A of a circuit structure according to a second embodiment of the present invention, respectively.
Figure 3B:
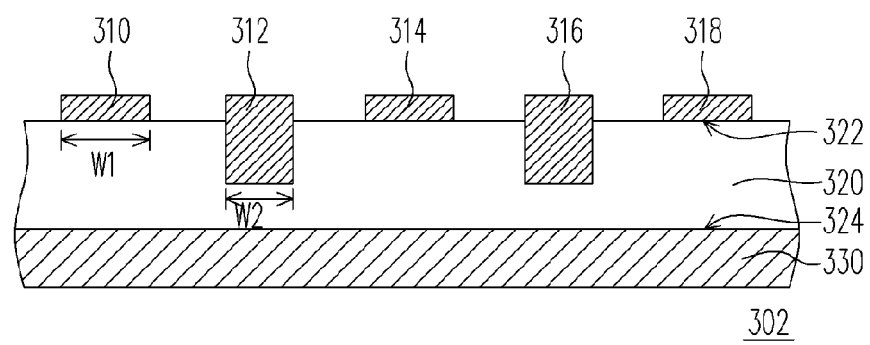

FIGS. 3A and 3B schematically show a top view and a sectional view along with the line III—III in FIG. 3A of a circuit structure according to a second embodiment of the present invention, respectively. For example, the circuit structure 302 comprises a plurality of first lines 310, 314, 318, a plurality of second lines 312, 316, a dielectric layer 320, and a reference plane 330. Wherein, the dielectric layer 320 comprises an upper surface 322 and a lower surface 324, and the first lines 310, 314, 318 are disposed on the upper surface 322 of the dielectric layer 320, on which the base of the first lines 310, 314, 318 is aligned with the upper surface 322 of the dielectric layer 320. In addition, the second lines 312, 316 are also disposed on the dielectric layer 320; however, differently from the first lines 310, 314, 318, the base of the second lines 312, 316 is embedded below the upper surface 322, such that the base of the second lines 312, 316 and the base of the first lines 310, 314, 318 are not on the same plane.

In the present embodiment, at least one first line 314 is disposed between the second lines 312, 316, or the first and second lines 310, 312, 314, 316, 318 are interleaved disposed in a sequential order as shown in the diagram. Therefore, the second lines 312, 316 are not restricted to be adjacently arranged as described in the first embodiment. Other arrangement also can be practiced in the present embodiment. However, the first embodiment and the second embodiment are functionally equivalent, which means they are capable of reducing the characteristic impedance by reducing the distance between the second lines 312, 316 and the reference plane 330 by embedding the second lines 312, 316 into the dielectric layer 320. Accordingly, the second lines 312, 316, originally having the same line width as that of the first lines 310, 314, 318, can be replaced with a thinner line. In other words, the line width W1 of the first lines 310, 314, 318 is greater than the line width W2 of the second lines 312, 316, thus the crosstalk between the signals is effectively reduced, and the free layout space of the substrate 300 is effectively increased. Wherein, the second lines 312, 316 are, for example, a differential signal-pair line or a clock signal-pair line. Wherein, the reference plane 330 is, for example, a power plane or a ground plane.

Figure 4A:
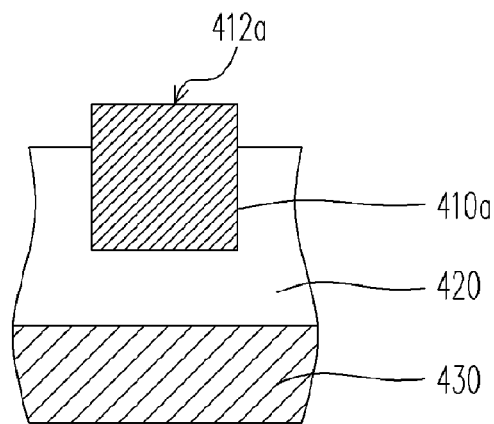
FIGS. 4A~4C schematically show a sectional view of each of the three circuit structures according to the present invention, respectively.
Figure 4B:
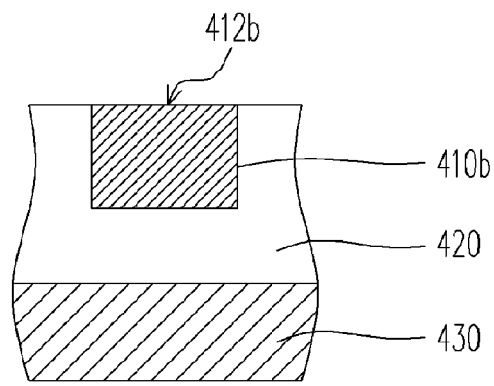
Figure 4C:
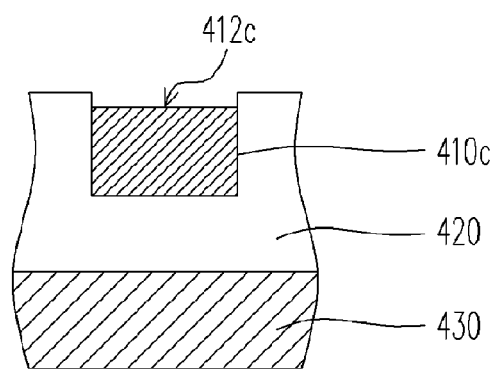

FIGS. 4A~4C schematically show a sectional view of each of the three circuit structures according to the present invention, respectively. In the present embodiment, three different embedded circuit structures are schematically shown in the diagrams as follows: a line 410a shown in FIG. 4A is embedded into a dielectric layer 420, and a partial surface 412a of the line 410a is extruded on an upper surface 422 of the dielectric layer 420; a line 410b shown in FIG. 4B is embedded into the dielectric layer 420, and a partial surface 412b of the line 410b is aligned with the upper surface 422 of the dielectric layer 420; and a line 410c shown in FIG. 4C is embedded into the dielectric layer 420, and an outer surface 412c of the line 410c and other surfaces are all disposed below the upper surface 422 of the dielectric layer 420. In addition, a reference plane 430 may be further disposed below a lower surface 424 of the dielectric layer 420, wherein the reference plane 430 may be a power plane or a ground plane.

All of the three embedded circuit structures mentioned above can be substantially applied on the first and second embodiments of the present invention, and their function has been described as mentioned above, thus details are omitted herein. When the present invention is physically applied on the surface line of the package substrate, a solder mask layer or anti-oxidation layer (not shown) can be further disposed on the upper surface 422 of the dielectric layer 420 and the partial surfaces 412a, 412b, 412c of the lines 410a, 410b, 410c. When the present invention is applied on the internal line of the package substrate, a dielectric layer (not shown) can be further disposed on the upper surface 422 of the dielectric layer 420 and the partial surfaces 412a, 412b, 412c of the lines 410a, 410b, 410c, and other lines are sequentially generated above the dielectric layer (not shown), such that a multilayer circuit substrate is formed.

In summary, the circuit structure of the present invention has the following advantages:

1. With the embedded circuit design, its line width is less than the line width of the neighboring line, thus the high frequency signal or other important signal can be faultlessly transmitted in the embedded line, such that the energy loss is reduced and the transmission quality is effectively improved.

2. With the embedded circuit design, the problem of the crosstalk between the signals due to the electromagnetic field coupling effect is effectively decreased.

3. The circuit structure can be widely applied on the transmission design of the large size PCB, package substrate, etc.

Although the invention has been described with reference to the particular embodiments thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A circuit structure of a package substrate, comprising:
a dielectric layer having an upper surface and a lower surface;
at least a first signal line disposed on the dielectric layer on which a base of the first signal line is aligned with the upper surface;
a plurality of second signal lines disposed on the dielectric layer on which a base of the second signal lines is embedded below the upper surface, wherein a distance between the first signal line and one of the second signal line neighboring therewith is greater than a distance between two adjacent second signal lines; and
a reference plane disposed below the lower surface of the dielectric layer.

2. The circuit structure of a package substrate of claim 1, wherein the first signal line is arranged on a side of the second signal lines.

3. The circuit structure of a package substrate of claim 1, wherein the first signal line is arranged between the second signal lines.

4. The circuit structure of a package substrate of claim 1, wherein the second signal lines are a differential signal-pair line.

5. The circuit structure of a package substrate of claim 1, wherein the second signal lines is a clock signal-pair line.

6. The circuit structure of a package substrate of claim 1, wherein the reference plane is a power plane or a ground plane.

7. The circuit structure of a package substrate of claim 1, further comprising a second dielectric layer which covers the upper surface of the dielectric layer, the first signal line, and the second signal lines.

8. The circuit structure of a package substrate of claim 1, further comprising a solder mask layer which covers the upper surface of the dielectric layer, the first signal line, and the second signal lines.

9. The circuit structure of a package substrate of claim 1, wherein a first distance is existed between the base of the first signal line and the reference plane, and a second distance is existed between the base of the second signal lines and the reference plane, and the first distance is greater than the second distance.

10. The circuit structure of a package substrate of claim 1, wherein the first signal line has a first line width, and the second signal lines have a second line width, and the first line width is greater than the second line width.

11. The circuit structure of a package substrate of claim 1, wherein a partial surface of at least one of the second signal lines is exposed on the upper surface.

12. The circuit structure of a package substrate of claim 1, wherein a partial surface of at least one of the second signal lines is aligned with the upper surface.

13. The circuit structure of a package substrate of claim 1, wherein all surfaces of at least one of the second signal lines are disposed below the upper surface.

14. The circuit structure of a package substrate of claim 1, wherein the first signal line and the second signal line are both made of copper.

15. A package substrate, comprising:
a dielectric layer having an upper surface and a lower surface;
a conductive plane disposed below the lower surface of the dielectric layer;
a surface circuit layer disposed on the upper surface of the dielectric layer and formed a topmost conductive layer, wherein the surface circuit layer comprising:
at least a first signal line disposed on the dielectric layer on which a base of the first signal line is aligned with the upper surface; and
a pair of second signal lines disposed on the dielectric layer on which a base of each second signal line is embedded below the upper surface, wherein one of the second signal lines are adjacent to the other, and the first signal line is adjacent to one side of the pair of second signal lines.

16. The circuit structure of a package substrate of claim 15, wherein the conductive plane is a power plane or a ground plane.

17. The circuit structure of a package substrate of claim 15, further comprising a second dielectric layer which covers the upper surface of the dielectric layer, the first signal line, and the pair of second signal lines.

18. The circuit structure of a package substrate of claim 15, further comprising a solder mask layer which covers the upper surface of the dielectric layer, the first signal line, and the pair of second signal lines.

19. The circuit structure of a package substrate of claim 15, wherein a first distance is existed between the base of the first signal line and the conductive plane, and a second distance is existed between the base of each second signal line and the conductive plane, and the first distance is greater than the second distance.

20. The circuit structure of a package substrate of claim 15, wherein the first signal line has a first line width, and each second signal line has a second line width, and the first line width is greater than the second line width.

21. The circuit structure of a package substrate of claim 15, wherein a partial surface of the pair of second signal lines is exposed on the upper surface.

22. The circuit structure of a package substrate of claim 15, wherein a partial surface of the pair of second signal lines is aligned with the upper surface.

23. The circuit structure of a package substrate of claim 15, wherein all surfaces of the pair of second signal lines are disposed below the upper surface.

24. The circuit structure of a package substrate of claim 15, wherein the first signal line and the pair of second signal lines are both made of copper.

* * * * *